United States Patent
Nakamura et al.

(10) Patent No.: US 8,268,718 B2
(45) Date of Patent: Sep. 18, 2012

(54) BONDED STRUCTURE AND MANUFACTURING METHOD FOR BONDED STRUCTURE

(75) Inventors: Taichi Nakamura, Osaka (JP); Akio Furusawa, Osaka (JP); Shigeaki Sakatani, Osaka (JP); Hidetoshi Kitaura, Osaka (JP); Takahiro Matsuo, Osaka (JP)

(73) Assignee: Panasonic Corporation, Osaka (JP)

( * ) Notice: Subject to any disclaimer, the term of this patent is extended or adjusted under 35 U.S.C. 154(b) by 16 days.

(21) Appl. No.: 13/007,693

(22) Filed: Jan. 17, 2011

(65) Prior Publication Data

US 2011/0175224 A1    Jul. 21, 2011

(30) Foreign Application Priority Data

Jan. 19, 2010 (JP) ................. 2010-008754

(51) Int. Cl.
*H01L 21/44* (2006.01)
(52) U.S. Cl. ........................ 438/614; 438/613
(58) Field of Classification Search .............. 257/782, 257/783, 780, 781, 737, 766; 438/612, 613, 438/614
See application file for complete search history.

(56) References Cited

U.S. PATENT DOCUMENTS

| | | | | |
|---|---|---|---|---|
| 5,476,726 A | * | 12/1995 | Harada et al. | 428/643 |
| 2006/0246304 A1 | * | 11/2006 | Ishihara et al. | 428/446 |
| 2009/0242249 A1 | * | 10/2009 | Furusawa et al. | 174/259 |
| 2010/0301481 A1 | * | 12/2010 | Furusawa et al. | 257/751 |
| 2011/0074020 A1 | * | 3/2011 | Yamakami et al. | 257/737 |

FOREIGN PATENT DOCUMENTS

JP    2007-281412 A    10/2007

* cited by examiner

*Primary Examiner* — S. V Clark
(74) *Attorney, Agent, or Firm* — RatnerPrestia

(57) ABSTRACT

A manufacturing method for a bonded structure, in which a semiconductor device is bonded to an electrode by a bonding portion, the method including: first mounting a solder ball, in which a surface of a Bi ball is coated with Ni plating, on the electrode that is heated to a temperature equal to or more than a melting point of Bi; second pressing the solder ball against the heated electrode, cracking the Ni plating, spreading molten Bi on a surface of the heated electrode, and forming a bonding material containing Bi-based intermetallic compound of Bi and Ni; and third mounting the semiconductor device on the bonding material.

3 Claims, 7 Drawing Sheets

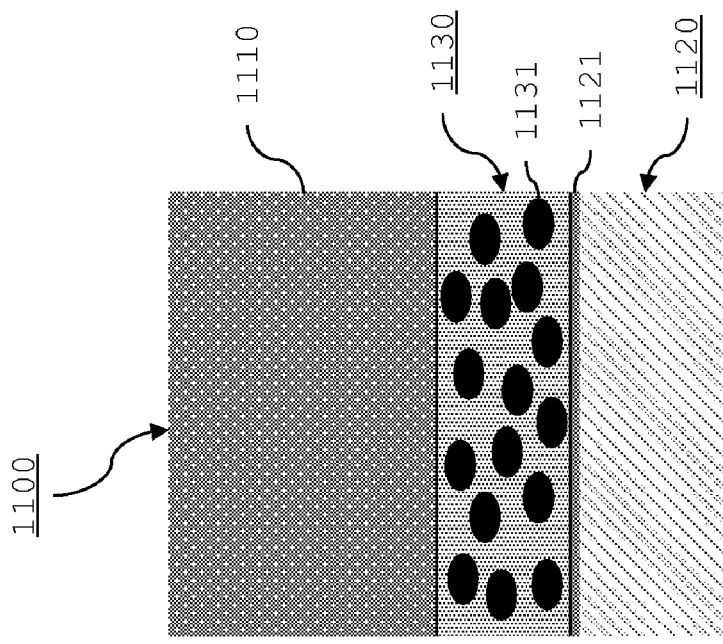
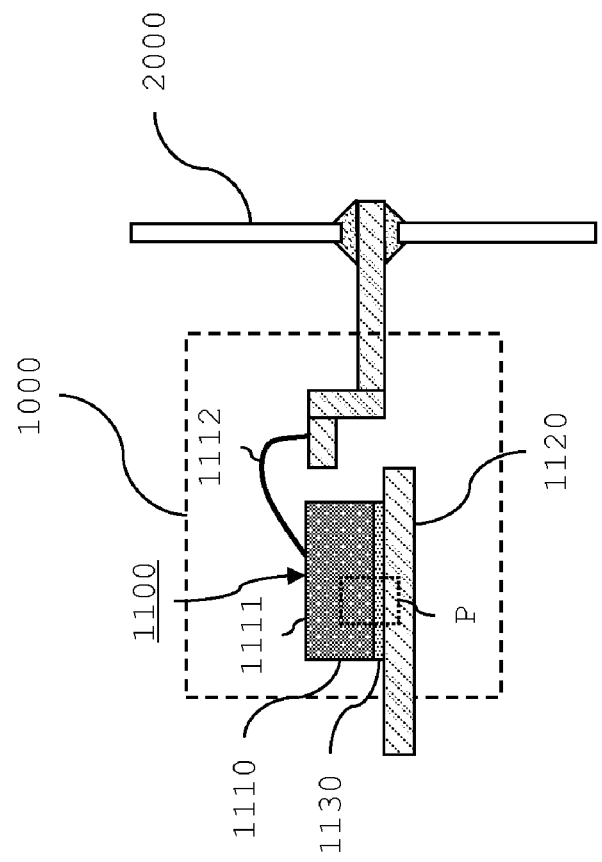
FIG. 1(A)
FIG. 1(B)

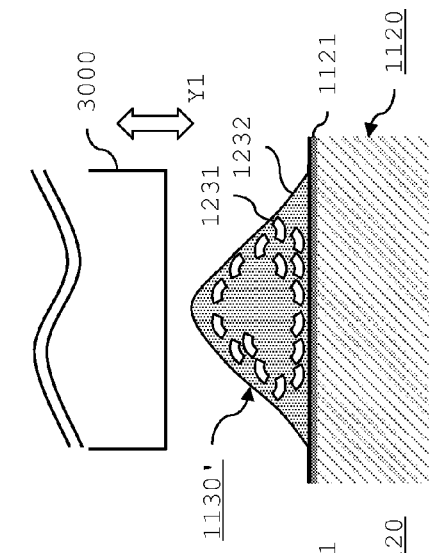
FIG. 3(A)
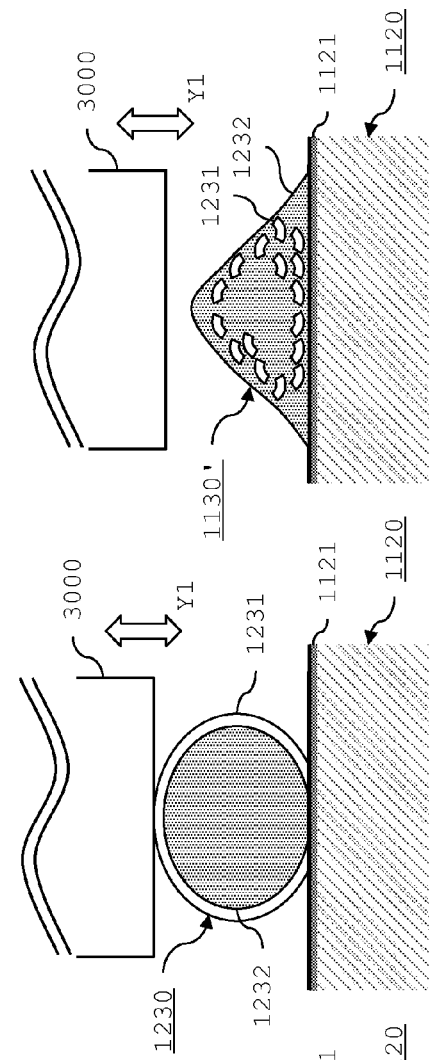
FIG. 3(B)
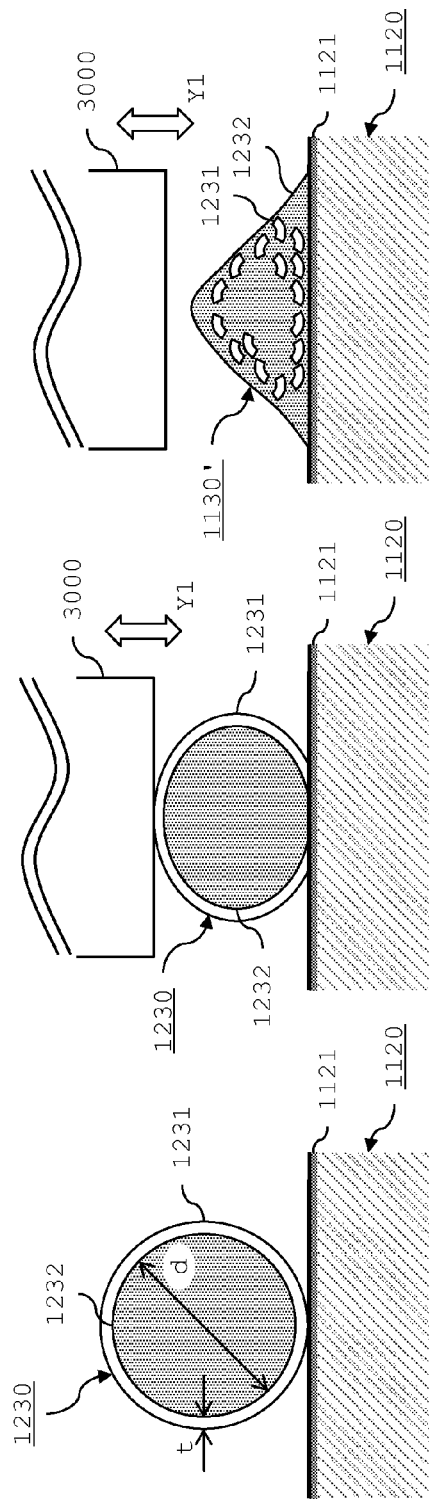
FIG. 3(C)
FIG. 3(D)
FIG. 3(E)
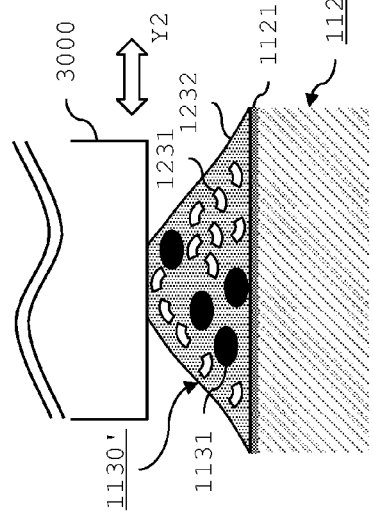
FIG. 3(F)

FIG. 5

| Sample Number | t (μm) | t/d | r (%) | Evaluation in Heat Test (280°C) | Evaluation in Heat Test (340°C) | Evaluation in Heat Test (400°C) |
| --- | --- | --- | --- | --- | --- | --- |
| 1 | 10 | 0.01 | 30 | Excellent | Poor | Poor |
| 2 | 16 | 0.016 | 38 | Excellent | Fair | Poor |
| 3 | 19 | 0.019 | 42 | Excellent | Fair | Poor |
| 4 | 22 | 0.022 | 60 | Excellent | Fair | Fair |
| 5 | 25 | 0.025 | 65 | Excellent | Fair | Fair |
| 6 | 28 | 0.028 | 72 | Excellent | Good | Fair |
| 7 | 31 | 0.031 | 76 | Excellent | Good | Fair |
| 8 | 35 | 0.035 | 84 | Excellent | Good | Good |
| 9 | 37 | 0.037 | 94 | Excellent | Excellent | Good |
| 10 | 39 | 0.039 | 100 | Excellent | Excellent | Excellent |

BONDED STRUCTURE AND MANUFACTURING METHOD FOR BONDED STRUCTURE

BACKGROUND OF THE INVENTION

1. Field of the Invention

The present invention relates to a bonded structure and a manufacturing method for the bonded structure that are available for use in a power semiconductor module in which a semiconductor device made of, e.g., SiC (silicon carbide) or GaN (gallium nitride) is bonded to an electrode by a bonding portion.

2. Related Art of the Invention

A material containing Bi (bismuth) or Zn (zinc) is receiving attention as the material for a bonding portion which bonds a semiconductor device to an electrode in a bonded structure of a power semiconductor module that has a higher melting point, is more environmentally-friendly, and is free from Pb (lead).

For example, assume that a Si (silicon) device whose amount of current that can be supplied per unit area is less than 50 mA/cm$^2$ is used as a semiconductor device of a power semiconductor module. In view of ensuring of wettability, ease of bonding, and the like, a material containing 90 wt % or more of Bi is considered to be suitable as the material for a bonding portion bonding the semiconductor device that may rise to about 150° C. to an electrode in this case.

Bi-2.5 wt % Ag (silver) has a melting point of about 262° C. and is a specific example of such a material mainly composed of Bi.

Note that pure Bi, Bi—CuAlMn having CuAlMn (copper, aluminum, and manganese) alloy particles dispersed in Bi, a material in which Cu is added to Bi, and a material in which Ni (nickel) is added to Bi are also known (see, e.g., Japanese Patent Laid-Open No. 2007-281412).

The configuration of a conventional bonded structure 6100 will be described with reference to FIG. 7.

Note that FIG. 7 is a schematic enlarged cross-sectional view of the conventional bonded structure 6100.

A semiconductor device 6110 is bonded to an electrode 6120 by a bonding portion 6130.

A surface-treated layer 6121 is formed on a surface on the bonding portion 6130 side of the electrode 6120.

The bonding portion 6130 is made of the material mainly composed of Bi described above.

SUMMARY OF THE INVENTION

There has recently been strong demand for higher output power in power semiconductor modules.

For this reason, power semiconductor modules using, e.g., a SiC device or a GaN device whose amount of current supplied can be made larger than a Si device as a semiconductor device are expected to serve as important devices which play a role not only in reducing the sizes of power semiconductor modules and but also in increasing the output power.

In a power semiconductor module, the temperature of a semiconductor device increases with an increase in the amount of current supplied to the semiconductor device.

For example, although the temperature of a Si device whose amount of current supplied is less than 50 mA/cm$^2$ rises only up to about 150° C., the temperature of a SiC device or a GaN device whose amount of current supplied is not less than 50 mA/cm$^2$ can rise as high as about 400° C.

Accordingly, the material for a bonding portion which bonds a semiconductor device to an electrode has been required to have higher thermal resistance commensurate with the semiconductor device to be used.

More specifically, as described above, if a SiC device or a GaN device whose amount of current supplied is not less than 50 mA/cm$^2$ is used as the semiconductor device 6110, the temperature of the semiconductor device 6110 when the power semiconductor module is used rises as high as about 400° C.

Heat generated in the semiconductor device 6110 is dissipated toward the bonding portion 6130 in a direction indicated by an arrow Z. Accordingly, the temperature of the bonding portion 6130 may become significantly high, not less than the melting point of the material for the bonding portion 6130 (Bi-2.5 wt % Ag has a melting point of about 262° C., as described above).

As a result, the bonding portion 6130 melts when the power semiconductor module is used, and deformation of the bonded structure that may cause a short circuit, a break, a change in electric characteristics, or the like occurs. This may cause a critical defect in a final product.

Of course, the amount of current supplied to a semiconductor device may be limited such that the temperature of the semiconductor device does not rise to the melting point of the material for a bonding portion.

However, this approach runs counter to the trend of strong demand for higher output power in power semiconductor modules.

In conclusion, the thermal resistance of a bonding portion which bonds a semiconductor device to an electrode needs to be increased such that the bonding portion does not melt even when its temperature rises.

The present invention has been made in consideration of the above-described conventional problems, and provides a bonded structure and a manufacturing method for the bonded structure that are capable of inhibiting a bonding portion which bonds a semiconductor device to an electrode from melting.

The 1$^{st}$ aspect of the present invention is a manufacturing method for a bonded structure, in which a semiconductor device is bonded to an electrode by a bonding portion, the method comprising:

first mounting a solder ball, in which a surface of a Bi ball is coated with Ni plating, on the electrode that is heated to a temperature equal to or more than a melting point of Bi;

second pressing the solder ball against the heated electrode, cracking the Ni plating, spreading molten Bi on a surface of the heated electrode, and forming a bonding material containing Bi-based intermetallic compound of Bi and Ni; and third mounting the semiconductor device on the bonding material.

The 2$^{nd}$ aspect of the present invention is a manufacturing method for a bonded structure according to the 1$^{st}$ aspect of the present invention, wherein a thickness t of the Ni plating is substantially uniform.

The 3$^{rd}$ aspect of the present invention is a manufacturing method for a bonded structure according to the 1$^{st}$ aspect of the present invention, wherein a thickness t of the Ni plating and a diameter d of the Bi ball satisfy $$0.022 \leq t/d \leq 0.039. \qquad \text{(Expression 1)}$$

The 4$^{th}$ aspect of the present invention is a bonded structure in which a semiconductor device is bonded to an electrode by a bonding portion, wherein the bonding portion contains 60 wt % or more of a Bi-based intermetallic compound of Bi and Ni.

The 5$^{th}$ aspect of the present invention is a bonded structure according to the 4$^{th}$ aspect of the present invention, wherein the Bi-based intermetallic compound is contained in the bonding portion in a dispersed state.

With the configuration of the present invention, it is possible to provide a bonded structure and a manufacturing method for the bonded structure that are capable of inhibiting a bonding portion which bonds a semiconductor device to an electrode from melting.

BRIEF DESCRIPTION OF THE DRAWINGS

FIG. 1(A) is a schematic cross-sectional view of a power semiconductor module according to an embodiment of the present invention, and FIG. 1(B) is a schematic enlarged cross-sectional view of a portion P of a bonded structure according to the embodiment of the present invention;

FIG. 3(A) is a schematic cross-sectional view for explaining a solder ball mounting step of a manufacturing method for the bonded structure according to the embodiment of the present invention, FIG. 3(B) is a schematic cross-sectional view for explaining (a first stage of) a bonding material forming step of the manufacturing method for the bonded structure according to the embodiment of the present invention, FIG. 3(C) is a schematic cross-sectional view for explaining (a second stage of) the bonding material forming step of the manufacturing method for the bonded structure according to the embodiment of the present invention, FIG. 3(D) is a schematic cross-sectional view for explaining (a third stage of) the bonding material forming step of the manufacturing method for the bonded structure according to the embodiment of the present invention, FIG. 3(E) is a schematic cross-sectional view for explaining (a fourth stage of) the bonding material forming step of the manufacturing method for the bonded structure according to the embodiment of the present invention, and FIG. 3(F) is a schematic cross-sectional view for explaining a semiconductor device mounting step of the manufacturing method for the bonded structure according to the embodiment of the present invention;

FIG. 5 is an explanatory chart for explaining results of heat tests performed on various forms of the bonded structure with different weight percentages r of the Bi-based intermetallic compound, according to the embodiment of the present invention;

DESCRIPTION OF SYMBOLS 1000 power semiconductor module
1100 bonded structure
1110 semiconductor device
1111 semiconductor device upper surface portion
1112 bonding wire
1120 electrode
1121 surface-treated layer
1130 bonding portion
1130' bonding material
1131 Bi-based intermetallic compound
1230 solder ball
1231 Ni plating
1232 Bi ball
2000 substrate
3000 tool

PREFERRED EMBODIMENTS OF THE INVENTION

An embodiment of the present invention will be described in detail below with reference to the drawings.

(Embodiment)

The configuration of a bonded structure 1100 in which a semiconductor device 1110 is bonded to an electrode 1120 by a bonding portion 1130 according to the embodiment of the present invention will be described first primarily with reference to FIGS. 1(A) and 1(B).

Note that FIG. 1(A) is a schematic cross-sectional view of a power semiconductor module 1000 according to the embodiment of the present invention, and FIG. 1(B) is a schematic enlarged cross-sectional view of a portion P (see FIG. 1(A)) of the bonded structure 1100 according to the embodiment of the present invention.

The power semiconductor module 1000 is mounted on a substrate 2000.

The bonded structure 1100 is formed in the power semiconductor module 1000.

The configurations of the bonding portion 1130, the electrode 1120, and the semiconductor device 1110 will be described in detail primarily with reference to FIG. 1(B).

(Configuration of Bonding Portion 1130)

The bonding portion 1130 contains substantially 60 wt % or more of a Bi-based intermetallic compound 1131 of Bi (bismuth) and Ni (nickel).

The Bi-based intermetallic compound 1131 is contained in the bonding portion 1130 in a dispersed state.

The thickness of the bonding portion 1130 is about 20 to 50 μm.

The melting point of pure Bi (Bi) is about 271° C., the melting point of pure Ni (Ni) is about 1455° C., and the melting point of the Bi-based intermetallic compound ($Bi_3Ni$) is about 460° C.

Figure 2:
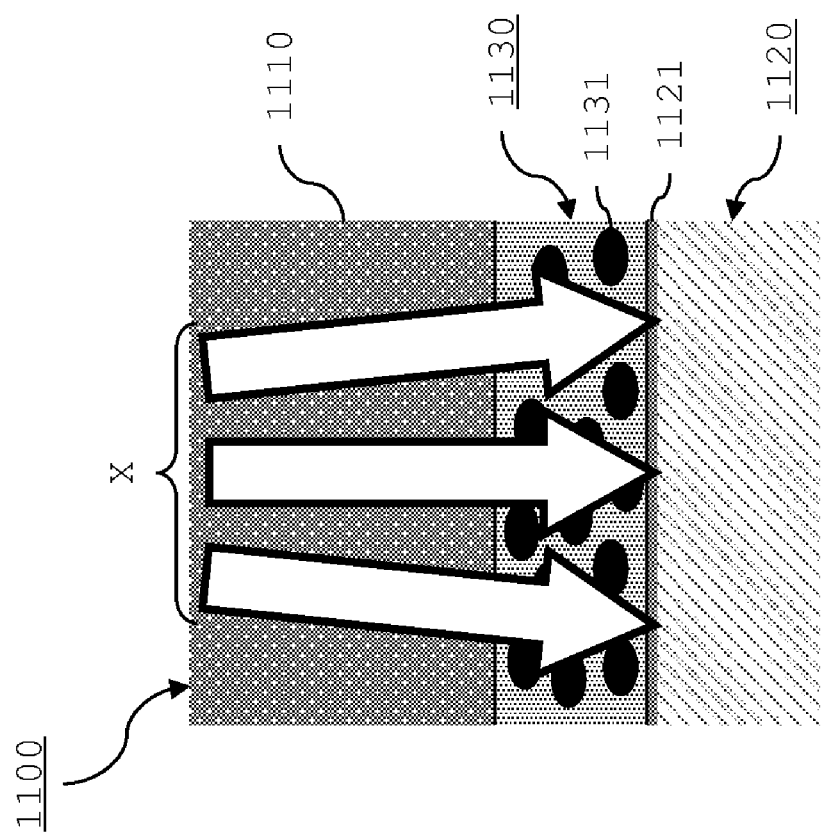
FIG. 2 is a schematic enlarged cross-sectional view for explaining dissipation of heat generated in a semiconductor device of the bonded structure according to the embodiment of the present invention toward a bonding portion.

As described above, the temperature of the semiconductor device 1110 when the power semiconductor module 1000 is used rises as high as about 400° C., and heat generated in the semiconductor device 1110 is dissipated toward the bonding portion 1130 in a direction indicated by arrows X, as shown in FIG. 2. Accordingly, the temperature of the bonding portion 1130 may become significantly high.

Note that FIG. 2 is a schematic enlarged cross-sectional view for explaining dissipation of heat generated in the semiconductor device 1110 of the bonded structure 1100 according to the embodiment of the present invention toward the bonding portion 1130.

As will be described in detail later, if the bonding portion 1130 contains substantially 60 wt % or more of the Bi-based intermetallic compound 1131, the bonding portion 1130, which bonds the semiconductor device 1110 to the electrode 1120, can be inhibited from melting.

This is because if unmolten $Bi_3Ni$ particles contained in the bonding portion 1130 in a dispersed state can prevent molten Bi particles from flowing out, the overall viscosity of the materials for the bonding portion 1130 can be considered sufficiently high even when the power semiconductor module is used.

Accordingly, even if the semiconductor device 1110 whose amount of current supplied is increased to heighten the output power of the power semiconductor module 1000 and whose temperature may become significantly high is used, sufficient thermal resistance of the bonding portion 1130 can be ensured, and deformation of the bonded structure 1100 that may cause a short circuit, a break, a change in electric characteristics, or the like can be inhibited.

(Configuration of Electrode 1120)

The electrode 1120 is made of a Cu (copper) alloy or the like.

The size of the electrode 1120 is about 5 mm×4 mm.

A surface-treated layer 1121 having a thickness of about 1 μm is formed as a film on a surface on the bonding portion 1130 side of the electrode 1120 such that the wettability of the electrode 1120 to a bonding material 1130' (see FIGS. 3(C) to 3(E)) is ensured.

Note that although the surface-treated layer 1121 is made of Ag (silver), it may be made of, e.g., Au (gold), Ni, or Pd (palladium), which has good wettability to the bonding material 1130'.

Although the surface-treated layer 1121 is formed by electroplating, it may be formed by the evaporation method, electroless plating, or the like.

(Configuration of Semiconductor Device 1110)

The semiconductor device 1110 is a power semiconductor device such as a high-power transistor used in a semiconductor package.

The semiconductor device 1110 is made of at least one of (1) SiC (silicon carbide), SiGe (silicon germanium), GaN (gallium nitride), GaAs (gallium arsenide), InP (indium phosphide), ZnS (zinc sulfide), and ZnSe (zinc selenide) that are compound semiconductors, (2) Si (silicon), (3) Ge (germanium), and the like.

The semiconductor device 1110 is cut out from a wafer having a diameter of about 6 inches.

Note that although the semiconductor device 1110 has a size of about 4.5 mm×3.5 mm, it may have a large size of about 6 mm×5 mm or a small size of about 3 mm×2.5 mm or about 2 mm×1.6 mm, depending on functional requirements of the semiconductor device 1110 and the like.

Although the thickness of the semiconductor device 1110, i.e., the above-described wafer is about 0.3 mm, it may be about 0.15 mm, 0.2 mm, or 0.4 mm, depending on the size of the semiconductor device 1110 and the like.

A bonding wire 1112 is connected to a semiconductor device upper surface portion 1111 of the semiconductor device 1110 so as to provide wire bonding connection with the substrate 2000.

A manufacturing method for the bonded structure 1100, in which the semiconductor device 1110 is bonded to the electrode 1120 by the bonding portion 1130, according to this embodiment will be described primarily with reference to FIGS. 3(A) to 3(F).

Note that FIG. 3(A) is a schematic cross-sectional view for explaining a solder ball mounting step of the manufacturing method for the bonded structure 1100 according to the embodiment of the present invention, FIG. 3(B) is a schematic cross-sectional view for explaining (a first stage of) a bonding material forming step of the manufacturing method for the bonded structure 1100 according to the embodiment of the present invention, FIG. 3(C) is a schematic cross-sectional view for explaining (a second stage of) the bonding material forming step of the manufacturing method for the bonded structure 1100 according to the embodiment of the present invention, FIG. 3(D) is a schematic cross-sectional view for explaining (a third stage of) the bonding material forming step of the manufacturing method for the bonded structure 1100 according to the embodiment of the present invention, FIG. 3(E) is a schematic cross-sectional view for explaining (a fourth stage of) the bonding material forming step of the manufacturing method for the bonded structure 1100 according to the embodiment of the present invention, and FIG. 3(F) is a schematic cross-sectional view for explaining a semiconductor device mounting step of the manufacturing method for the bonded structure 1100 according to the embodiment of the present invention.

The manufacturing method for the bonded structure 1100 according to this embodiment comprises the solder ball mounting step, the bonding material forming step, and the semiconductor device mounting step, as will be described in detail below.

(Solder Ball Mounting Step)

A solder ball 1230, in which the surface of a Bi ball 1232 is coated with Ni plating 1231, is mounted on the electrode 1120 that is heated to a temperature equal to or more than the melting point of Bi.

Note that although the number of solder balls 1230 is one, the number may be two or more.

A diameter d (mm) of the Bi ball 1232 is about 1.0 mm.

The Bi ball 1232 is formed by the molten solder ejection method, which adjusts the amount of molten Bi ejected from above according to the diameter d.

A thickness t (μm) of the Ni plating 1231 is substantially uniform.

Note that the thickness t of the Ni plating 1231 is about 22 to 39 μm. In other words, the Ni plating 1231 has an average thickness of about 22 to 39 μm for four arbitrary points. Variations from the average thickness only need to fall within the range of about 5 to 8 μm.

The Ni plating 1231 is formed by barrel electroplating, which adjusts plating current density and plating time according to the thickness t.

The thickness t of the Ni plating 1231 and the diameter d of the Bi ball 1232 substantially satisfy $$0.022 \leq t/d \leq 0.039. \qquad \text{(Expression 1)}$$

As will be described in detail later, if the thickness t and the diameter d satisfy (Expression 1), the bonding portion 1130 contains substantially 60 wt % or more of the Bi-based intermetallic compound 1131, as described above.

(Bonding Material Forming Step)

The solder ball 1230 is pressed against the heated electrode 1120, the Ni plating 1231 is cracked, molten Bi is spread on a surface of the heated electrode 1120, and the bonding material 1130' containing the Bi-based intermetallic compound 1131 of Bi and Ni is formed.

Note that the solder ball 1230 is pressed with a pressing force of about 100 gf using a stainless steel tool 3000 incompatible with solder which is moved primarily in a direction indicated by an arrow Y1. It suffices that cracks appear in the Ni plating 1231 in contact with the electrode 1120, that the Ni plating 1231 is cracked, and that the Bi ball 1232 melts to flow from within the solder ball 1230.

The molten Bi ball 1232 is wetly spread using the tool 3000 which is moved primarily in a direction indicated by an arrow Y2 such that the size on the surface of the electrode 1120 is substantially equal to the size of the semiconductor device 1110. In other words, it suffices that the Bi ball 1232 is wetly spread such that the size on the surface of the electrode 1120 is substantially not less than the size of the semiconductor device 1110 and substantially not more than the size of the electrode 1120 to reduce unfilled portions in the formed bonding portion 1130.

The Ni plating 1231 rips at a thin portion, and the Bi ball 1232 melts to flow out. The cracked Ni plating 1231 diffuses along with the outflow.

Ni particles undergo a diffusion reaction with molten Bi particles around them.

As described above, variations from the average thickness of the Ni plating 1231 are within the range of about 5 to 8 μm. For this reason and other reasons, it will be understood that the thickness of the cracked Ni plating 1231 is not exactly the same at all portions.

Accordingly, a phenomenon may occur in which Ni particles react with Bi particles immediately with little time to diffuse due to the short period of time to completion of the reaction at a thin portion, and Ni particles float across molten Bi particles and reach an inner portion without Ni to react with Bi particles due to the long period of time to completion of the reaction at a thick portion.

Since the surface of the Bi ball 1232 is coated with the Ni plating 1231, the bonding material 1130' containing the Bi-based intermetallic compound 1131 in a dispersed state is formed on the surface of the electrode 1120 with the assistance of the above-described phenomenon.

The dispersion of the Bi-based intermetallic compound 1131 can be confirmed by performing surface analysis on a broken surface of the manufactured bonded structure 1100 by means of an X-ray electron spectroscopic instrument.

The solder ball mounting step and the bonding material forming step described so far are performed, (1) in a state where the electrode 1120 is heated to about 300 to 320° C., which is not less than the melting point of Bi, and (2) in an atmosphere of a reducing gas such as nitrogen gas containing 5% hydrogen such that oxidation of solder caused by heating is suppressed and such that an oxide film on the surface of the electrode 1120 is reduced.

Since the solder ball 1230 with a small specific surface area is used, it suffices to perform the steps described so far in the atmosphere of the reducing gas in order to suppress oxidation of solder, and solder wettability is easily ensured (If a powder mixture of Bi and Ni with a large specific surface area is used, solder needs to be supplied in paste form using flux containing a reducing agent such as an organic acid in order to sufficiently suppress oxidation of the solder, which requires an additional step of cleaning an active ingredient derived from the flux after die bonding).

Of course, temperature control may be performed, for example, such that the electrode 1120 is heated to about 300° C. in the steps described above and such that the electrode 1120 is heated to about 320° C. so as to securely bond the semiconductor device 1110 to the electrode 1120 during an early stage of a semiconductor device mounting step (to be described later).

(Semiconductor Device Mounting Step)

The semiconductor device 1110 is mounted on the bonding material 1130'.

The heated electrode 1120 is then cooled to a room temperature of about 25° C. When the bonding material 1130' solidifies to serve as the bonding portion 1130, and the semiconductor device 1110 is bonded to the electrode 1120, manufacture of the bonded structure 1100 is completed.

The point that if the thickness t of the Ni plating 1231 and the diameter d of the Bi ball 1232 satisfy (Expression 1), the bonding portion 1130 contains substantially 60 wt % or more of the Bi-based intermetallic compound 1131 will be described in detail primarily with reference to FIG. 4.

Figure 4:
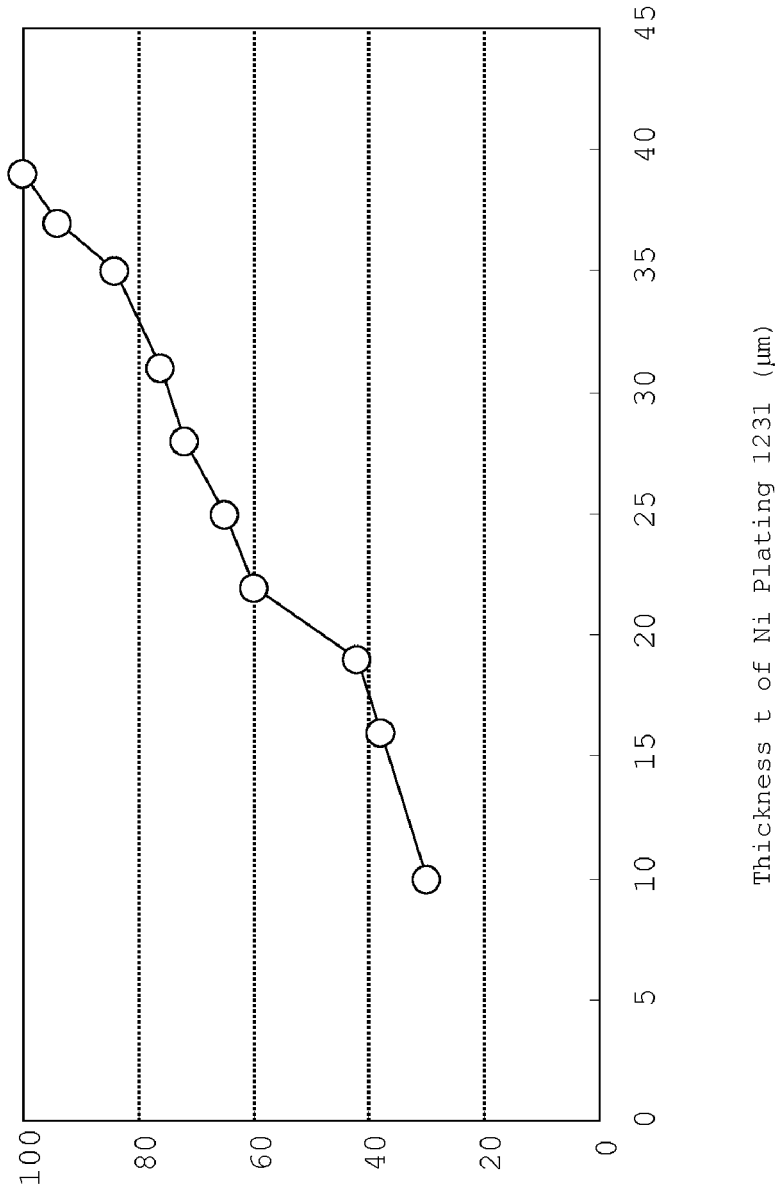
FIG. 4 is an explanatory graph for explaining the relationship between a thickness t of Ni plating and a weight percentage r of a Bi-based intermetallic compound at the bonding portion in a normalized case where a diameter d of a Bi ball is about 1.0 mm, according to the embodiment of the present invention.

Note that FIG. 4 is an explanatory graph for explaining the relationship between the thickness t of the Ni plating 1231 and a weight percentage r of the Bi-based intermetallic compound 1131 at the bonding portion 1130 in a normalized case where the diameter d of the Bi ball 1232 is about 1.0 mm, according to the embodiment of the present invention.

The weight percentage r of the Bi-based intermetallic compound 1131 at the bonding portion 1130 is calculated by performing surface analysis on the entire broken surface of the bonding portion 1130 by means of the X-ray electron spectroscopic instrument.

Since the normalized case where the diameter d of the Bi ball 1232 is about 1.0 mm is assumed here, the weight percentage r of the Bi-based intermetallic compound 1131 at the bonding portion 1130 increases with an increase in the thickness t of the Ni plating 1231.

For example, if t=22 μm, then t/d=0.022 and r=60%.

If t=39 μm, then t/d=0.039 and r=100%.

If t<39 μm, then all Ni atoms constituting the Ni plating 1231 react with a part of Bi atoms constituting the Bi ball 1232. Accordingly, even after the Bi-based intermetallic compound 1131 is generated, Bi atoms are left.

If t=39 μm, then all the Ni atoms constituting the Ni plating 1231 exactly react with all the Bi atoms constituting the Bi ball 1232. Accordingly, after the Bi-based intermetallic compound 1131 is generated, no Bi atoms are left.

In a general case different from the normalized case as well, if t/d=0.022, then r=60%, and if t/d=0.039, then r=100%.

When the diameter d of the Bi ball 1232 is multiplied by a factor of k (>0), if the thickness t of the Ni plating 1231 is similarly multiplied by a factor of k, then the weight of Bi atoms constituting the Bi ball 1232, the weight of Ni atoms constituting the Ni plating 1231, and the weight of the Bi-based intermetallic compound 1131 as a product are all multiplied by a factor of $k^3$. The statement is thus not surprising.

If the solder ball 1230 is designed to satisfy (Expression 1) even in a general case where the diameter d of the Bi ball 1232 is not always about 1.0 mm, the bonding portion 1130 contains substantially 60 wt % or more of the Bi-based intermetallic compound 1131, i.e., the weight percentage of Bi atoms left after the reaction which do not constitute $Bi_3Ni$ is substantially 40% or less, ignoring unavoidable impurities.

For example, if the diameter d of the Bi ball 1232 is first selected according to the size of the semiconductor device 1110 and the like, the thickness t of the Ni plating 1231 only needs to be selected so as to satisfy (Expression 1).

The point that if the thickness t of the Ni plating 1231 and the diameter d of the Bi ball 1232 satisfy (Expression 1), the bonding portion 1130 contains substantially 60 wt % or more of the Bi-based intermetallic compound 1131 has been described in detail above.

The point that if the bonding portion 1130 contains substantially 60 wt % or more of the Bi-based intermetallic compound 1131, the bonding portion 1130, which bonds the semiconductor device 1110 to the electrode 1120, can be inhibited from melting will be described in detail primarily with reference to FIG. 5.

Note that FIG. 5 is an explanatory chart for explaining results of heat tests performed on various forms of the bonded structure 1100 with the different weight percentages r of the Bi-based intermetallic compound 1131 at the bonding portion 1130, according to the embodiment of the present invention.

The normalized case where the diameter d of the Bi ball 1232 is about 1.0 mm is also assumed here. Samples with sample numbers of 1 to 10 whose Ni plating 1231 have the various thicknesses t in the range of about 10 to 39 μm are prepared.

Accordingly, as described above, in one of the samples in which the thickness t of the Ni plating 1231 is larger, the weight percentage r of the Bi-based intermetallic compound 1131 at the bonding portion 1130 is also larger.

For example, r=60% in the sample with the sample number of 4 in which t=22 μm, and r=100% in the sample with the sample number of 10 in which t=39 μm.

In order to check the thermal resistance of the bonding portion 1130, a heating element whose planar size is substantially equal to that of the semiconductor device 1110 is brought into contact with the semiconductor device upper surface portion 1111 for 2 minutes, and the amount by which the material for the bonding portion 1130 melts at the semiconductor device surface portion 1111 is confirmed.

In the amount of heat generated by the heating element, the surface temperature of the heating element is set to rise to 280° C., 340° C., or 400° C. after the power supply is turned on and be kept at that temperature for 1 minute.

The reasons that the temperatures of 280° C., 340° C., and 400° C. are selected as surface temperatures of the heating element in heat tests are as follows.

The temperature of 280° C. is higher than the melting point (about 271° C.) of pure Bi by about 10° C. The temperature of 280° C. can be said to be a temperature at which the need to check the thermal resistance of the bonding portion 1130 begins to be created.

The temperature of 340° C. is intermediate between the temperature of 280° C. and the temperature of 400° C. The temperature of 340° C. can be said to be a temperature at which the thermal resistance of the bonding portion 1130 needs to be checked in order to confirm the qualitative tendency in the relationship between the thickness t of the Ni plating 1231, i.e., the weight percentage r of the Bi-based intermetallic compound 1131 at the bonding portion 1130, and the thermal resistance of the bonding portion 1130.

The temperature of 400° C. is the temperature (about 400° C.) of the semiconductor device 1110 when a SiC device or a GaN device is used as the semiconductor device 1110. The temperature of 400° C. can be said to be a temperature at which the thermal resistance of the bonding portion 1130 needs to be checked in order to respond to the trend of strong demand for higher output power in power semiconductor modules.

An evaluation value A (%) calculated by (Expression 2) below was used to evaluate the amount by which the material for the bonding portion 1130 melts.

$$A=100\times(S-S_0)/S_0 \quad \text{(Expression 2)}$$

where $S_0$ (mm$^2$) represents an area over which the material for the bonding portion 1130 wetly spreads on the semiconductor device upper surface portion 1111 before the heating element is brought into contact with the semiconductor device upper surface portion 1111, and S (mm$^2$) represents an area over which the material for the bonding portion 1130 wetly spreads on the semiconductor device upper surface portion 1111 after the heating element is brought into contact with the semiconductor device upper surface portion 1111.

Each sample is rated using the evaluation value A on a four-point scale of "excellent," "good," "fair," and "poor" in a heat test.

If A=0%, the amount by which the material for the bonding portion 1130 melts is considered to be 0. The sample is rated as "excellent" in the heat test.

If 0%<A≦10%, the amount by which the material for the bonding portion 1130 melts is considered to be extremely small. The sample is rated as "good" in the heat test.

If 10%<A≦20%, the amount by which the material for the bonding portion 1130 melts is considered to be small. The sample is rated as "fair" in the heat test.

If A>20%, the amount by which the material for the bonding portion 1130 melts is considered to be large. The sample is rated as "poor" in the heat test.

At the time of each heat test, the bonded structure 1100 is not sealed for ease of conducting the heat test. However, when the bonded structure 1100 is used in an actual product, the bonded structure 1100 is sealed with resin.

Accordingly, deformation of the bonded structure 1100 used in an actual product is sufficiently suppressed by the resin unless the amount by which the material for the bonding portion 1130 melts is large.

That is, samples rated as "excellent," "good," or "fair" in the heat tests can be said to be suitable for practical use.

Results of the heat tests will be described in detail below.

(Case where Surface Temperature of Heating Element in Heat Test is 280° C.)

Any of the samples (10 μm≦t≦39 μm, 30%≦r≦100%) is rated as "excellent" in the heat test.

It can be seen from this that the amount by which the material for the bonding portion 1130 melts is 0 even in the sample with the sample number of 1 (t=10 μm, r=30%) that is considered to be rated the lowest in heat tests.

(Case where Surface Temperature of Heating Element in Heat Test is 340° C.)

Although the sample with the sample number of 1 (t=10 μm, r=30%) is rated as "poor" in the heat test, the samples with the sample numbers of 2 to 5 (16 μm≦t≦25 μm, 38%≦r≦65%) are rated as "fair" in the heat test, the samples with the sample numbers of 6 to 8 (28 μm≦t≦35 μm, 72%≦r≦84%) are rated as "good" in the heat test, and the samples with the sample numbers of 9 and 10 (37 μm≦t≦39 μm, 94%≦r≦100%) are rated as "excellent" in the heat test.

(Case where Surface Temperature of Heating Element in Heat Test is 400° C.)

Although the samples with the sample number of 1 to 3 (10 μm≦t≦19 μm, 30%≦r≦42%) are rated as "poor" in the heat test, the samples with the sample numbers of 4 to 7 (22 μm≦t≦31 μm, 60%≦r≦76%) are rated as "fair" in the heat test, the samples with the sample numbers of 8 and 9 (35 μm≦t≦37 μm, 84%≦r≦94%) are rated as "good" in the heat test, and the sample with the sample number of 10 (t=39 μm, r=100%) is rated as "excellent" in the heat test.

Since no Bi atoms are left in the sample with the sample number of 10 (t=39 μm, r=100%) that is considered to be rated the highest in heat tests, as described above, it can be seen that the amount by which the material for the bonding portion 1130 melts is still 0.

According to the results of the three types of heat tests, the samples with the sample number of 4 to 10 (22 μm≦t≦39 μm, 60%≦r≦100%) can be said to be suitable for practical use even when the semiconductor device 1110 whose temperature rises to about 400° C. due to an increase in the output power of the power semiconductor module 1000 is used.

Accordingly, even if the semiconductor device 1110 whose amount of current supplied is increased to heighten the output power of the power semiconductor module 1000 and whose temperature may become significantly high is used, the solder ball 1230 can be designed such that sufficient thermal resistance of the bonding portion 1130 can be ensured and such that deformation of the bonded structure 1100 that may cause a short circuit, a break, a change in electric characteristics, or the like is suppressed.

The point that if the bonding portion 1130 contains substantially 60 wt % or more of the Bi-based intermetallic compound 1131, the bonding portion 1130, which bonds the semiconductor device 1110 to the electrode 1120, can be inhibited from melting has been described in detail above.

Figure 6:
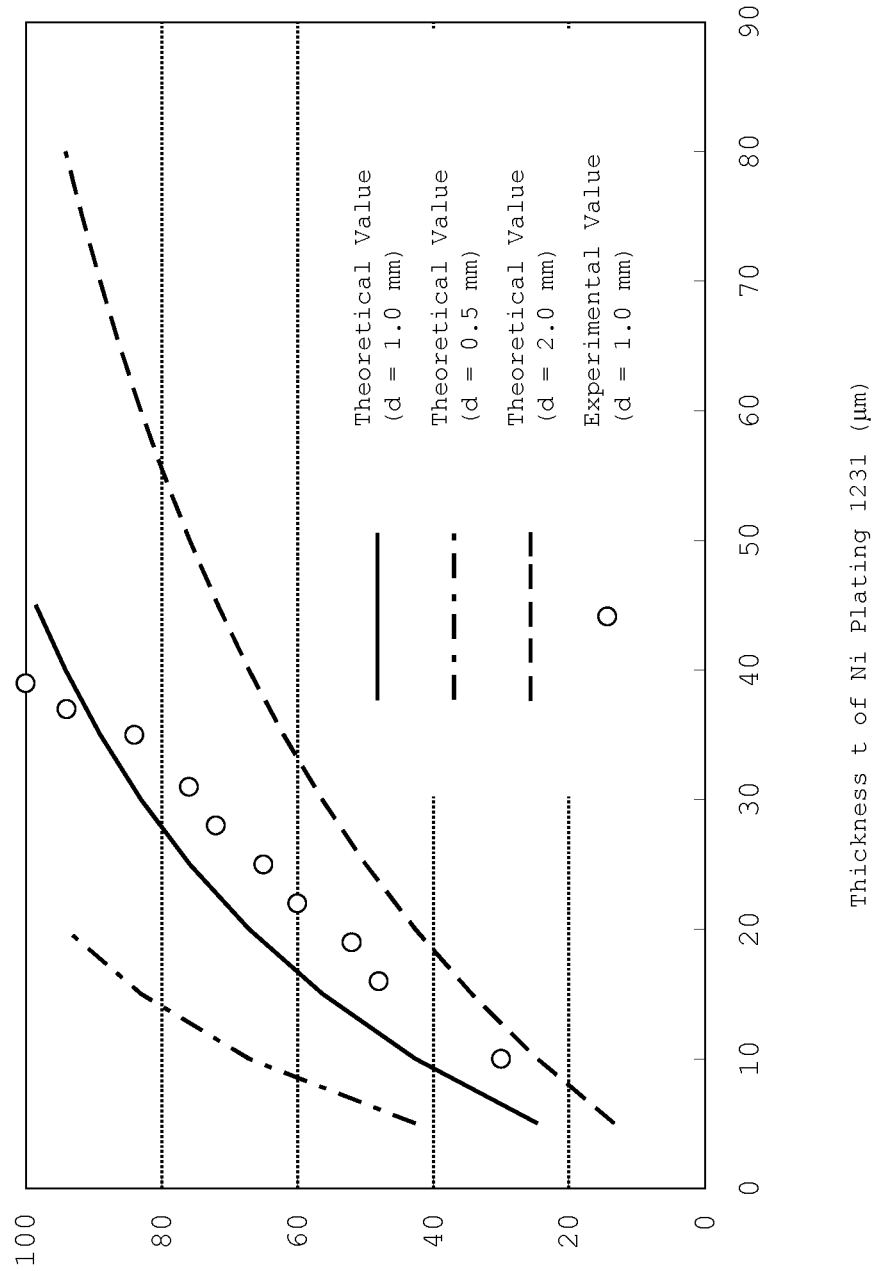
FIG. 6 is an explanatory graph for explaining experimentally or theoretically obtained relationships between the thickness t of Ni plating and the weight percentage r of the Bi-based intermetallic compound at the bonding portion, according to the embodiment of the present invention.
Figure 7:
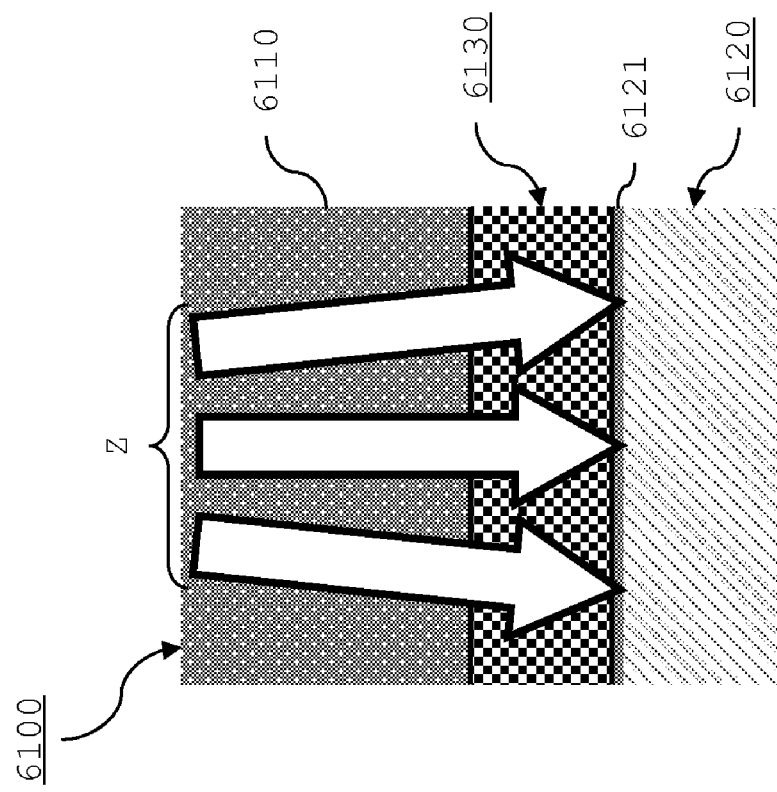
FIG. 7 is a schematic enlarged cross-sectional view of a conventional bonded structure.

Finally, the point that if the thickness t of the Ni plating 1231 and the diameter d of the Bi ball 1232 satisfy (Expression 1), the bonding portion 1130 contains substantially 60 wt % or more of the Bi-based intermetallic compound 1131 not only from the experimental perspective described above but also from a theoretical perspective will be supplementarily described primarily with reference to FIG. 6.

Note that FIG. 6 is an explanatory graph for explaining experimentally or theoretically obtained relationships between the thickness t of Ni plating 1231 and the weight percentage r of the Bi-based intermetallic compound 1131 at the bonding portion 1130, according to the embodiment of the present invention.

A solid curve shows the theoretically obtained relationship between the thickness t and the weight percentage r (theoretical value) in the normalized case where the diameter d of the Bi ball 1232 is 1.0 mm.

An alternate long and short dash curve shows the theoretically obtained relationship between the thickness t and the weight percentage r (theoretical value) when the diameter d of the Bi ball 1232 is half that in the normalized case, i.e., 0.5 mm.

A broken curve shows the theoretically obtained relationship between the thickness t and the weight percentage r (theoretical value) when the diameter d of the Bi ball 1232 is twice that in the normalized case, i.e., 2.0 mm.

A curve plotted with white circles shows the experimentally obtained relationship between the thickness t and the weight percentage r (experimental value) in the normalized case where the diameter d of the Bi ball 1232 is about 1.0 mm.

The weight percentage r (theoretical value) is obtained by calculating the weight of $Bi_3Ni$ generated using the atomic weight ratio of Bi with Ni calculated from the atomic weights of Bi and Ni and the densities of Bi and Ni based on the assumption that the diameter of the Bi ball 1232 and the thickness of the Ni plating 1231 are uniform.

Later, a generation of $Bi_3Ni$ will be explained stoichiometrically.

The weight percentage r (experimental value) is nothing less than an actual measurement value obtained for each of the samples with the sample number of 1 to 10 described above.

The error between the weight percentage r (theoretical value) and the weight percentage r (experimental value) in the normalized case is less than 30%, and the theoretical value is considered to be fit to the experimental value.

The reason that the theoretical value is not fully consistent with the experimental value is considered to be because, for example, the diameter of the Bi ball 1232 and the thickness of the Ni plating 1231 are not strictly uniform.

As an addendum, a generation of $Bi_3Ni$ is now explained stoichiometrically.

If, compared with Ni ($n_2$ mols), Bi ($n_1$ mols) exists adequately ($3n_2 \leq n_1$), then Ni atoms will all react with Bi atoms, $Bi_3Ni$ ($n_2$ mols) will be generated, and Bi ($n_1-3n_2$ mols) may exist.

Of course, since the volume $V_{Bi}$ of the Bi ball 1232 is expressed as $$V_{Bi} = 4\pi(d/2)^3/3,$$

the volume $V_{Ni}$ of the Ni plating 1231 is expressed as $$V_{Ni} = 4\pi(d/2+t)^3/3 - 4\pi(d/2)^3/3,$$

and $$n_1 = \rho_{Bi} V_{Bi}/M_{Bi},$$

$$n_2 = \rho_{Ni} V_{Ni}/M_{Ni},$$

the weight percentage r of the Bi-based intermetallic compound 1131 at the bonding portion 1130 is therefore expressed as $$r = 100 \times n_2 M_{Bi3Ni}/\{n_2 M_{Bi3Ni} + (n_1 - 3n_2) M_{Bi}\},$$

and thus, in case the weight percentage r satisfies (Expression 3) below, the bonding portion 1130 contains substantially 60 wt % or more of the Bi-based intermetallic compound 1131 as described above.

$$60 \leq r. \quad \text{(Expression 3)}$$

Here, $\rho_{Bi}$ is the density of the Bi ball 1232,
$\rho_{Ni}$ is the density of the Ni plating 1231,
$M_{Bi}$ is the molar mass (constant) of Bi,
$M_{Ni}$ is the molar mass (constant) of Ni, and
$M_{Bi3Ni} = 3M_{Bi} + M_{Ni}$ is the molar mass (constant) of $Bi_3Ni$.
$n_1$ and $n_2$ are both cubic homogenous polynomials of t and d because $V_{Bi}$ and $V_{Ni}$ are both cubic homogenous polynomials of t and d.

Consequently, it is considered that r is a monotonely increasing function of $n_2/n_1$ and thus a monotonely increasing function of t/d.

Furthermore, r=0 when $n_2/n_1=0$, and r=100 when $n_2/n_1=1/3$.

The bonded structure and the manufacturing method for the bonded structure according to the present invention are capable of inhibiting a bonding portion which bonds a semiconductor device to an electrode from melting, and are useful, for example, as a bonded structure and a manufacturing method for the bonded structure that are available for use in a power semiconductor module in which a semiconductor device made of, e.g., SiC or GaN is bonded to an electrode by a bonding portion.

What is claimed is:

1. A manufacturing method for a bonded structure, in which a semiconductor device is bonded to an electrode by a bonding portion, the method comprising:
    first mounting a solder ball, in which a surface of a Bi ball is coated with Ni plating, on the electrode that is heated to a temperature equal to or more than a melting point of Bi;
    second pressing the solder ball against the heated electrode, cracking the Ni plating, spreading molten Bi on a surface of the heated electrode, and forming a bonding material containing Bi-based intermetallic compound of Bi and Ni; and
    third mounting the semiconductor device on the bonding material.

2. A manufacturing method for a bonded structure according to claim 1, wherein a thickness t of the Ni plating is substantially uniform.

3. A manufacturing method for a bonded structure according to claim 1, wherein a thickness t of the Ni plating and a diameter d of the Bi ball satisfy $$0.022 \leq t/d \leq 0.039 \quad \text{(Expression 1).}$$

* * * * *

UNITED STATES PATENT AND TRADEMARK OFFICE
CERTIFICATE OF CORRECTION

PATENT NO. : 8,268,718 B2
APPLICATION NO. : 13/007693
DATED : September 18, 2012
INVENTOR(S) : Taichi Nakamura et al.

Page 1 of 1

It is certified that error appears in the above-identified patent and that said Letters Patent is hereby corrected as shown below:

At column 12, line 65 of the Letters Patent, in claim 3 (original claim 3):

"$0.022 \leq t/d0.039$     (Expression 1)"

should read

--$0.022 \leq t/d \leq 0.039$     (Expression 1)--

Signed and Sealed this
Fifth Day of February, 2013

Teresa Stanek Rea
*Acting Director of the United States Patent and Trademark Office*